United States Patent
Hong et al.

[11] Patent Number: 6,121,110
[45] Date of Patent: Sep. 19, 2000

[54] TRENCH ISOLATION METHOD FOR SEMICONDUCTOR DEVICE

[75] Inventors: Soo-jin Hong; Yu-gyun Shin, both of Seoul; Han-sin Lee, Yongin; Hyun-cheol Choe, Seoul, all of Rep. of Korea

[73] Assignee: Samsung Electronics Co., Ltd., Suwon, Rep. of Korea

[21] Appl. No.: 09/124,093

[22] Filed: Jul. 29, 1998

[30] Foreign Application Priority Data

May 11, 1998 [KR] Rep. of Korea ............... 98-16788

[51] Int. Cl.⁷ .................................................. H01L 21/76
[52] U.S. Cl. .................. 438/400; 438/434; 438/445; 437/67; 437/69; 437/70
[58] Field of Search ........................ 438/434, 445; 437/69, 67, 70

[56] References Cited

U.S. PATENT DOCUMENTS

| | | | |
|---|---|---|---|
| 5,395,790 | 3/1995 | Lur | 437/69 |
| 5,563,091 | 10/1996 | Lee | 437/70 |
| 5,683,932 | 11/1997 | Bashir et al. | 437/67 |
| 5,721,174 | 2/1998 | Pedious | 438/445 |
| 5,731,221 | 3/1998 | Kwon | 437/67 |
| 5,783,476 | 7/1998 | Arnold | 438/425 |
| 5,913,132 | 6/1999 | Tsai | 438/434 |
| 5,915,191 | 6/1999 | Jun | 438/431 |

FOREIGN PATENT DOCUMENTS 3185749 9/1991 Japan .

*Primary Examiner*—David Nelms
*Assistant Examiner*—Phuc Dang
*Attorney, Agent, or Firm*—Jones Volentine, LLC

[57] ABSTRACT

A trench isolation method is provided. In the trench isolation method, a pad oxide film, an oxidative film and an etching mask film are formed on a semiconductor substrate in sequence, and then a trench is formed in a field region of the semiconductor substrate. A oxide film is formed at the inner wall of the trench and the side walls of the oxidative film by oxidizing the semiconductor substrate. After filling the trench with a dielectric material, the pad oxide film, oxidative film and etching mask film formed in the active region are removed.

28 Claims, 7 Drawing Sheets

TRENCH ISOLATION METHOD FOR SEMICONDUCTOR DEVICE

BACKGROUND OF THE INVENTION

1. Field of the Invention

The present invention relates to an isolation method for a semiconductor device, and more particularly, to a trench isolation method for a semiconductor device.

2. Description of the Related Art

An isolation method in manufacturing of a semiconductor device is generally either a local oxidation of silicon (LOCOS) method or a trench isolation method.

In particular, the LOCOS method is simple, and has the advantage that a wide area and a narrow area can simultaneously be isolated. However, in a LOCOS method, a bird's beak caused by lateral oxidation can widen an isolation area, thereby reducing the effective area of a source/drain region. Also, when forming a field oxide layer, stress due to a difference in thermal expansion coefficients is concentrated on the edge of the oxide layer. As a result, crystalline defects can occur in a silicon substrate, causing high leakage currents.

As a result of this, a trench isolation method capable of implementing a smaller isolation area than by the LOCOS method is required. In this method, a trench formed in a silicon substrate is filled with dielectric material such as an oxide, to increase the effective isolation length.

However, one of the big problems in implementing a trench isolation structure is that a strong electric field is locally formed in a channel area adjacent to the side wall of the trench, so inversion easily occurs even at a low voltage, thereby increasing the current flowing between the source and the drain. In particular, when using a shallow trench isolation (STI) structure in a highly integrated semiconductor device, electrical characteristics of the device are determined by the profile of the edge of the trench.

FIG. 1 is a section view illustrating problems of a conventional shallow trench isolation (STI) method.

In FIG. 1, reference numeral 100 represents an active region, and reference numeral 200 represents an oxide layer filled in an STI region, which acts as a field region. Also, reference character "A" represents a profile before the oxide layer is wet-etched, and dashed lines designated by reference character "B" represent a profile after the wet-etching.

The oxide layer 200 filled in the trench is deposited by a general chemical vapor deposition (CVD) method. The oxide layer formed by the CVD method has a higher etching rate during the wet-etching process than a thermal oxide layer. As a result, the oxide layer 200 filled in the trench is etched excessively during the processes for etching various oxide layers such as pad oxide layer, sacrificial oxide layer and the oxide layer used as a buffer layer for ion implantation, which essentially follow the trench filling step. Because of this, the final height of the oxide layer 200 remaining in the trench is less than that of the active region 100, so the active region adjacent to the trench is exposed (as designated by reference character "C"). As a result, a hump phenomenon, where a transistor is turned on twice, and an inverse narrow width effect are caused as shown in FIG. 2, thereby deteriorating the performance of the transistor.

FIG. 2 is a graph showing characteristics of drain current of a transistor according to gate voltage. In the graph of FIG. 2, $V_B$ is 3V, and the transistor is turned on twice.

FIG. 3 is a graph showing an inverse narrow width effect by the conventional STI method. Here, as shown in FIG. 3 the inverse narrow width effect means that a threshold voltage decreases as the channel length of a transistor decreases. Reference character X represents the result observed before the hump phenomenon occurs, and reference character Y represents the result observed after the hump phenomenon occurs.

Recently, a method of thermally oxidizing polysilicon deposited in a trench after forming the trench has been suggested. According to this method, if the trench width is narrow, the trench may be completely filled by volumetric expansion while the polysilicon is oxidized. However, there is a problem in that stress is applied to the active region at the side wall of the trench. Also, due to the step coverage limitation of the polysilicon deposited in the trench, a collapse at the upper edge of the trench cannot effectively be prevented.

SUMMARY OF THE INVENTION

To solve the above problems, it is an objective of the present invention to provide a trench isolation method for a semiconductor device, in which a hump phenomenon and an inverse narrow width effect of a transistor can be prevented by improving the process, thereby resulting in a semiconductor device having excellent characteristics.

According to an aspect of the present invention, there is provided a trench isolation method for a semiconductor device. In this method, a pad oxide film, an oxidative film and an etching mask film are formed on a semiconductor substrate in sequence, and a trench is then formed in a field region of the semiconductor substrate. An oxide film is formed at the inner wall of the trench and the side walls of the oxidative film by oxidizing the semiconductor substrate. After filling the trench with a dielectric material, the pad oxide film, oxidative film and etching mask film formed in the active region are removed.

Preferably, the oxidative film is formed of polysilicon or amorphous silicon having a high oxidation rate, to a thickness of 300~1,000 Å, and the etching mask film is formed of a nitride having excellent etching selectivity with respect to the semiconductor substrate, to a thickness of 500~2,000 Å. Also, the oxide film formed at the inner wall of the trench and the side walls of the oxidative film may have a thickness of 100~500 Å. In order to fill the trench, a dielectric film is deposited on the resultant structure having the oxide film formed on the inner wall of the trench and the side walls of the oxidative film, and then the surface of the dielectric film is planarized. Further, the resultant structure having the dielectric film may be annealed at a high temperature to densify the dielectric film, before planarizing the surface of the dielectric film.

According to another aspect of the present invention, there is provided a trench isolation method for a semiconductor substrate. In this method, a pad oxide film is formed on a semiconductor substrate and then an etching mask film pattern, and an undercut oxidative film pattern beneath the etching mask film pattern are formed on the pad oxide film to define a field region. After forming a trench in the field region of the semiconductor substrate, an oxide film is formed on the inner wall of the trench and the side walls of the oxidative film pattern. After filling the trench with a dielectric material and planarizing the dielectric material filled in the trench, the etching mask film pattern, oxidative film pattern and pad oxide film are removed.

Preferably, the semiconductor substrate is recessed at the same time as the undercut oxidative film is formed, and the oxidative film is formed of polysilicon or amorphous silicon having a high oxidation rate, to a thickness of 300~1,000 Å, and the etching mask film is formed of nitride to a thickness of 500~2,000 Å.

Preferably, in order to form the etching mask film pattern and the undercut oxidative film pattern, an oxidative film and an etching mask film are formed on the pad oxide film, and the pad oxide film of the field region is then exposed by anisotropically etching the etching mask film and oxidative film in sequence. Then, the side walls of the oxidative film are isotropically etched.

Preferably, when forming the etching mask film pattern and the undercut oxidative film pattern, an oxidative film and an etching mask film are formed on the pad oxide film, and then the etching mask film is patterned. Then, the oxidative film is isotropically and anisotropically etched in sequence.

Preferably, the trench isolation method further comprises the step of annealing the semiconductor substrate at a high temperature to densify the dielectric material before the planarization, after the trench is filled with the dielectric material.

According to still another aspect of the present invention, there is provided a trench isolation method for a semiconductor device. In this method, a pad oxide film, an oxidative film and an etching mask film are formed on a semiconductor substrate in sequence. After exposing the pad film in a field region, the surface of the semiconductor substrate in the field is oxidized to form a field oxide film. Then, the field oxide film formed on the surface of the semiconductor substrate is etched by using the etching mask film as a mask. After forming a trench in the semiconductor substrate using the etching mask film, an oxide film is formed on the inner wall of the trench and the side walls of the oxidative film. After filling the trench with a dielectric material and planarizing the dielectric material filled trench, the etching mask film, oxidative film and pad oxide film are removed.

Preferably, the oxidative film is formed of polysilicon or amorphous silicon having a high oxidation rate, to a thickness of 300~1,000 Å, and the etching mask film is formed of nitride to a thickness of 500~2,000 Å.

Preferably, when etching the field oxide film, the field oxide film formed on the surface of the semiconductor substrate and on the side walls of the oxidative film is completely removed. Also, the field oxide film formed on the semiconductor substrate may be anisotropically etched using the etching mask film as a mask, such that parts of the field oxide film remain on the side walls of the oxidative film. Here, the trench isolation method may further comprises the step of removing the parts of the field oxide film remaining on the side walls of the oxidative film.

Preferably, the trench isolation method further comprises the step of annealing the semiconductor substrate at a high temperature to densify the dielectric material before the planarization, after the trench is filled with the dielectric material.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
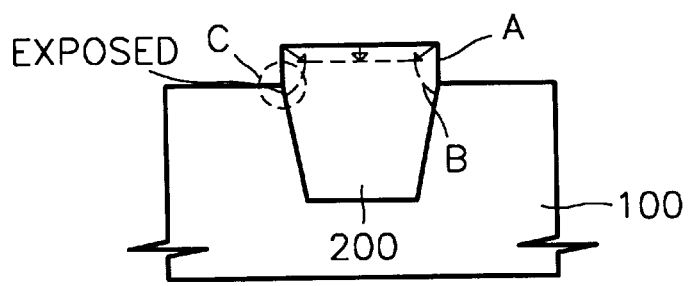
FIG. 1 is a section view illustrating problems of a conventional shallow trench isolation (STI) method.
Figure 2:
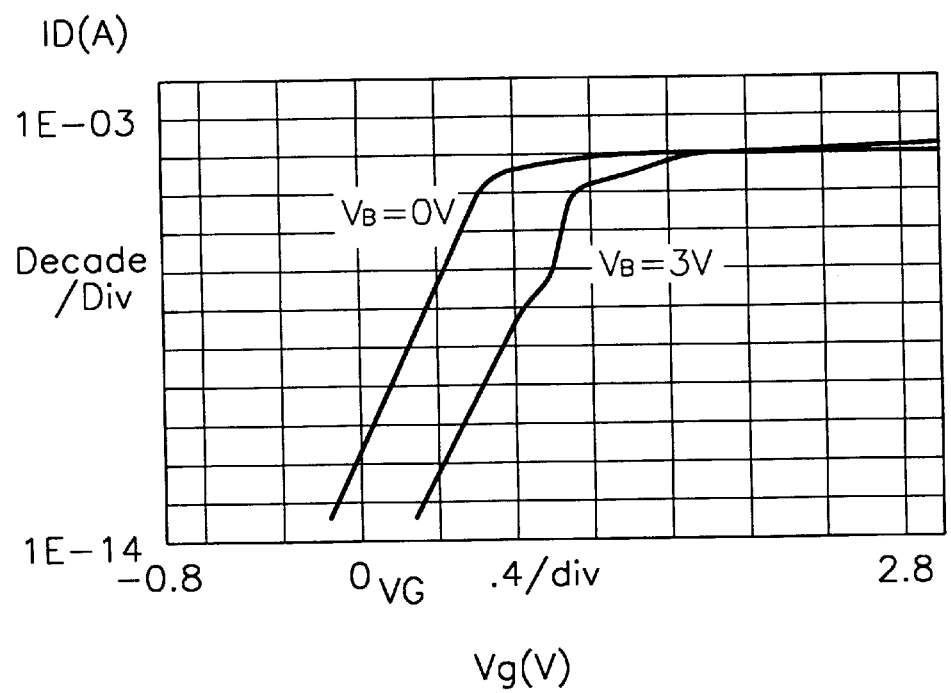
FIG. 2 is a graph showing a hump phenomenon caused by the conventional STI method.
Figure 3:
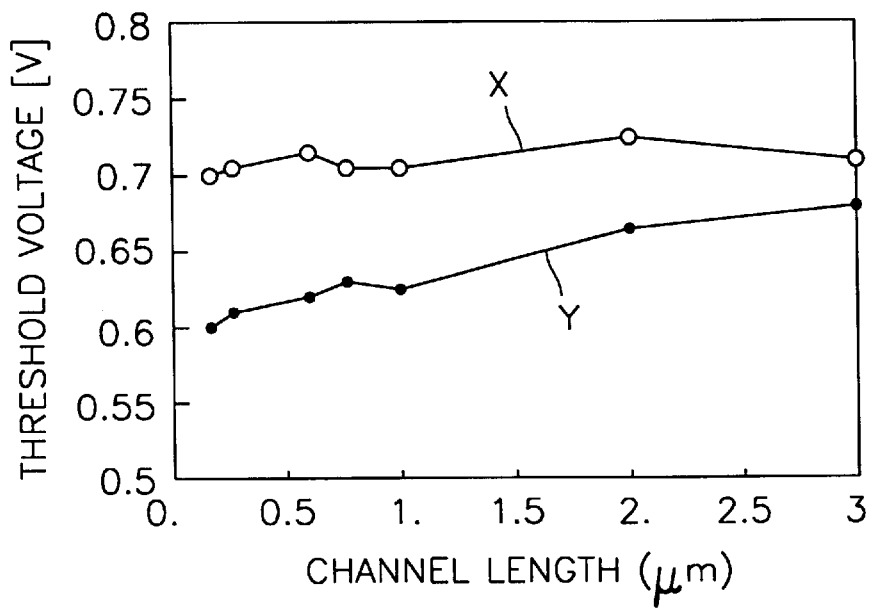
FIG. 3 is a graph showing an inverse narrow width effect of the conventional STI method.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concepts of the invention to those skilled in the art. In the drawings, the thicknesses of layers and regions are exaggerated for clarity, and the same reference numerals in different drawings represent the same element. It will also be understood that when a layer is referred to as being "on" or "over" another layer or substrate, it can be directly on the other layer or substrate, or intervening layers may also be present.

EXAMPLE 1

FIGS. 4 through 9 are section views illustrating a trench isolation method according to a first embodiment of the present invention.

Figure 4:
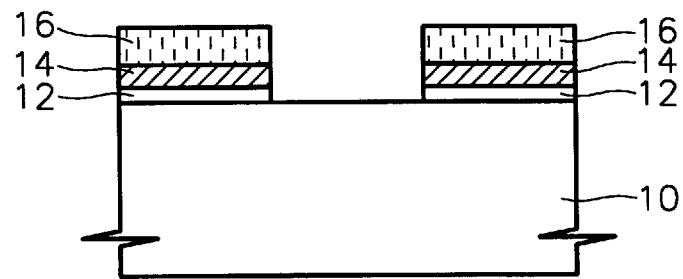
FIGS. 4 through 9 are section views illustrating a trench isolation method according to a first embodiment of the present invention.

Referring to FIG. 4, a thermal oxide film is grown on a semiconductor substrate 10 to a predetermined thickness, to form a pad oxide film 12 for relieving the substrate from stress and for protecting the substrate. A material capable of being oxidized during the oxidation process, e.g., polysilicon or amorphous silicon, is deposited to a thickness of preferably 300~1,000 Å to form an oxidative film 14.

An etching mask film 16 is then formed on the oxidative film 14, to be used as a mask when etching the substrate to form a trench, or when planarizing the trench filling material. The etching mask film 16 is preferably formed of a material which has an excellent etching selectivity with respect to the semiconductor substrate 10 during the process of etching the substrate or planarizing the trench filling material, e.g., silicon nitride (SiN) or boron nitride (BN), to a thickness of preferably 500~2,500 Å.

Next, a photoresist pattern (not shown) exposing a field region is formed on the etching mask film 16 by a photolithography process. The etching mask film 16, the oxidative film 14, and the pad oxide film 12 are anisotropically etched in sequence, using the photoresist pattern as a mask, thereby exposing the semiconductor substrate 10 in the field region.

Here, the photoresist pattern (not shown) may be removed or used as an etching mask in the following trench forming process.

Figure 5:
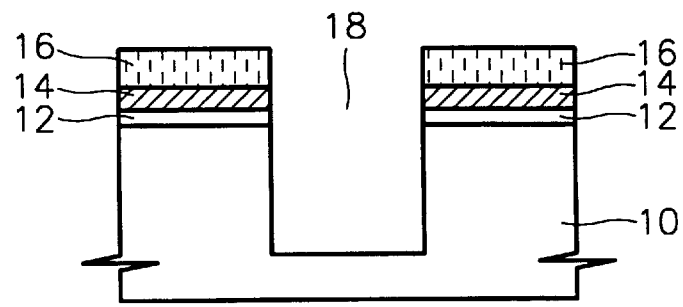

Referring to FIG. 5, after removing the photoresist pattern, the exposed semiconductor substrate is anisotropically etched to a depth of preferably about 2,000~10,000 Å by using the etching mask film 16 as an etching mask, thereby resulting in a trench 18. Here, the trench 18 may be formed by using the photoresist pattern as an etching mask if the photoresist pattern is not removed.

Figure 6:
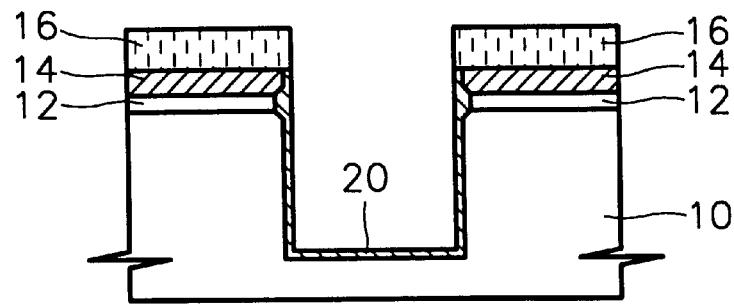

Referring to FIG. 6, a predetermined thermal oxidation process is performed on the semiconductor substrate 10 having the trench, to form a thermal oxide film 20 on the inner walls of the trench. During the thermal oxidation process, the oxidative film 14 is partially oxidized, so that the thermal oxide film 20 extends into the side walls of the oxidative film 14.

In general, the thermal oxide film 20 has a lower etching selectivity during the wet-etching process than an oxide film formed by a CVD method, which is a preferred trench-filling material. Thus, the thermal oxide film 20 formed at the side walls of the oxidative film 14 prevents the consumption of the material filled in the trench during the following wet etching process or planarizing process of the trench filling material, thereby preventing the active region at the edge of the trench from being exposed.

The thermal oxide film 20 is preferably formed to a thickness of 100~500 Å.

Figure 7:
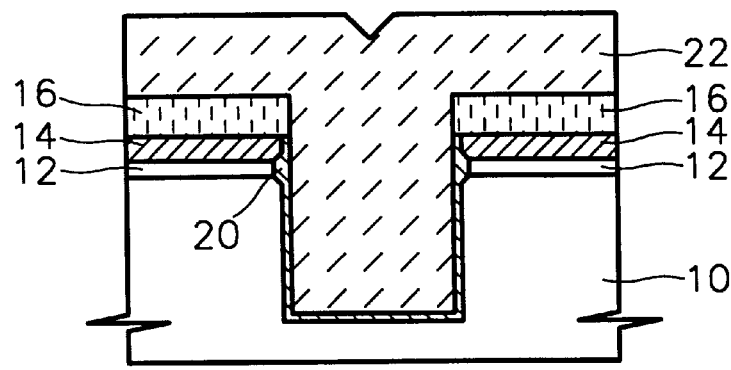

Referring to FIG. 7, a dielectric material is deposited on the entire surface of the resultant structure having the thermal oxide film 20, to a thickness such that the trench is completely filled, e.g., by a CVD method. After filling the trench with the oxide film (hereinafter referred to as CVD oxide film) 22 formed by the CVD method, the semiconductor substrate is annealed at a high temperature in the range of about 900~1,150° C. in order to densify the filled film.

Figure 8:
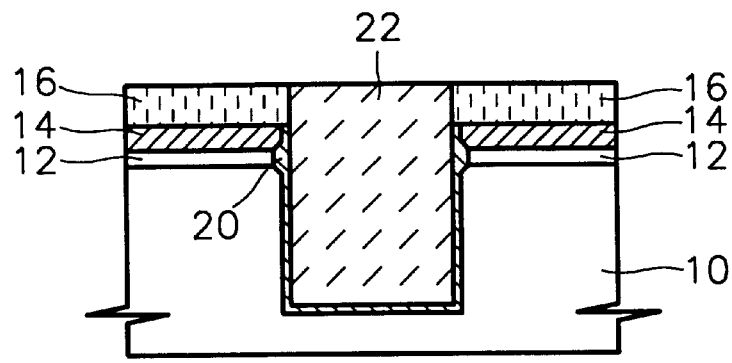
Figure 9:
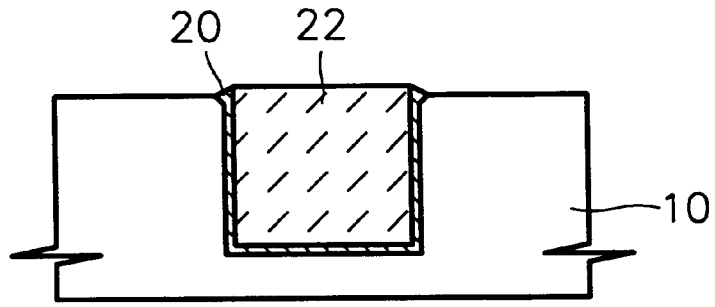

Referring to FIG. 8, a planarization process is then performed using the etching mask film 16 (see FIG. 7) formed in the active region as a stopper. A chemical mechanical polishing (CMP), an etch-back, or both CMP and etch-back are then performed. As a result, the surface of the CVD oxide film filled in the trench is planarized. Lastly, the etching mask film 16, oxidative film 14 and pad oxide film 12 are removed in sequence through wet-etching, thereby resulting in an isolation film 22 having an excellent profile where the edge of the trench is not exposed, as shown in FIG. 9.

Here, during the wet-etching process for removing the etching mask film, 16 oxidative film 14 and pad oxide film12, the CVD oxide film 22 filled in the trench is etched. However, because the thermal oxide film 20 having a lower etching selectivity than the CVD oxide film 22 is formed at the sides of the oxidative film 14, the consumption of the CVD oxide film can be minimized, and the edge of the trench can be prevented from being exposed.

EXAMPLE 2

FIGS. 10A through 13 are section views illustrating a trench isolation method according to a second embodiment of the present invention.

Figure 10A:
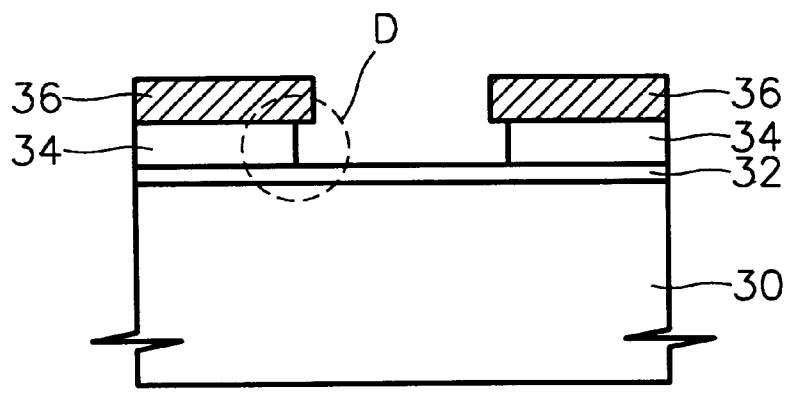
FIGS. 10A through 13 are section views illustrating a trench isolation method according to a second embodiment of the present invention.

Referring to FIG. 10A, a pad oxide film 32, an oxidative film 34, and an etching mask film 36 are sequentially formed on a semiconductor substrate 30 by the same method as in Example 1. Then, a photoresist pattern (not shown) exposing the field region of the etching mask film 36 is formed by a photolithography process. The etching mask film 36 and the oxidative film 34 are anisotropically etched in sequence using the photoresist pattern (not shown) as a mask, thereby exposing the pad oxide film 32 of the field region. When anisotropically etching the oxidative film 34, a chloride gas ($Cl_2$) or a mixture of chloride ($Cl_2$) gas and sulfur hexafluoride ($SF_6$) gas is used such that an undercut (enclosed by circle "D" in FIG. 10A) is formed beneath the etching mask film 36.

Figure 13:
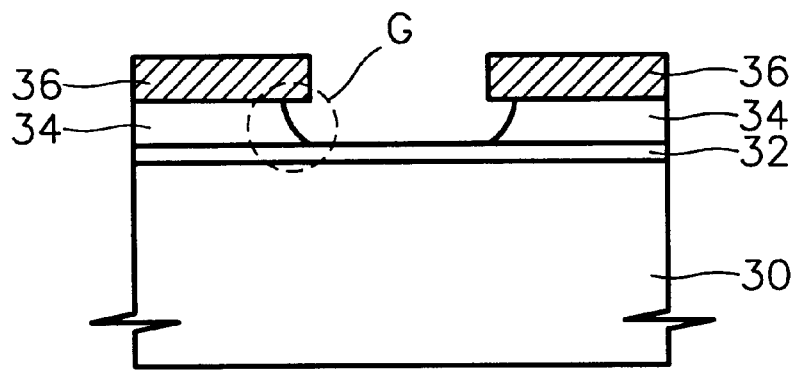

Here, as shown in FIG. 13, the undercut may be formed by anisotropically etching the etching mask 36, and then isotropically etching the exposed oxidative film 34 using polysilicon etchant. In FIG. 13, the area of undercut is shown in the area enclosed by circle "G."

Another process of exposing the field region will be briefly described.

Figure 10B:
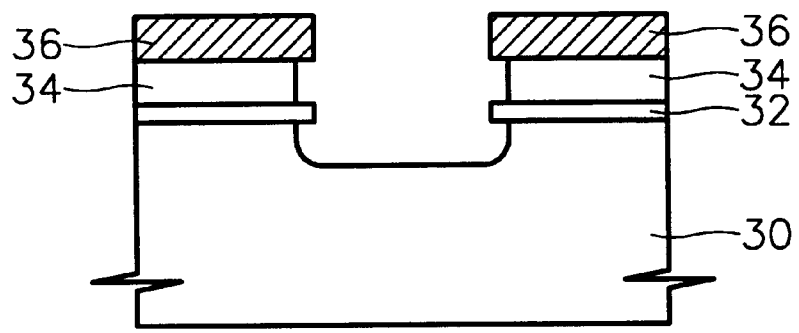

As shown in FIG. 10B, the etching mask film 36, oxidative film 34, and pad oxide film 32 are anisotropically etched in sequence to expose the semiconductor substrate 30. Then, the sides of the oxidative film 34 are etched, preferably using a polysilicon etchant in which nitric acid, acetic acid, fluoric acid, and deionized water are mixed at a ratio of 40:1:2:20, to form an undercut, and the semiconductor substrate 30 is recessed.

When the oxidative film 34 is formed beneath the etching mask film 36, the excessive removal of the CVD oxide film filled in the trench is delayed during the following process for etching the oxide film, as much as the thickness of the thermal oxide film by oxidizing the oxidative film 34, so that the exposure of the active region can be avoided. Further, when an undercut is formed beneath the etching mask 36, the oxidative film 34 is oxidized into the active region as far as the length of undercut, so that margin of the exposure of the active region in the process of etching the oxide film can be secured. Preferably, the length of the undercut is approximately 100~700 Å.

Figure 11:
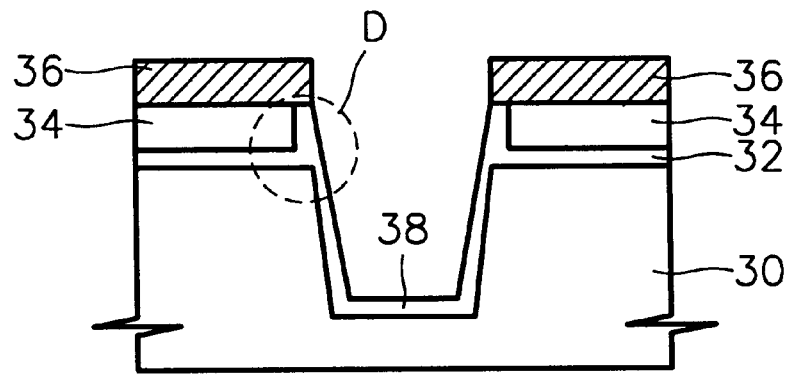

Referring to FIG. 11, a trench is formed in a semiconductor substrate by the same method as in Example 1. Then, a predetermined thermal oxidation process is performed on the semiconductor substrate having the trench, to form a thermal oxide film 38 on the inner walls of the trench. During the thermal oxidation process, the oxidative film 34 is partially oxidized. Here, due to the undercut, the thermal oxide film 38 grows into the active region as far as the length of the undercut. Thus, exposure of the active region at the edge of the trench during the following process can be further prevented as much as the length of the undercut, compared with Example 1.

Figure 12:
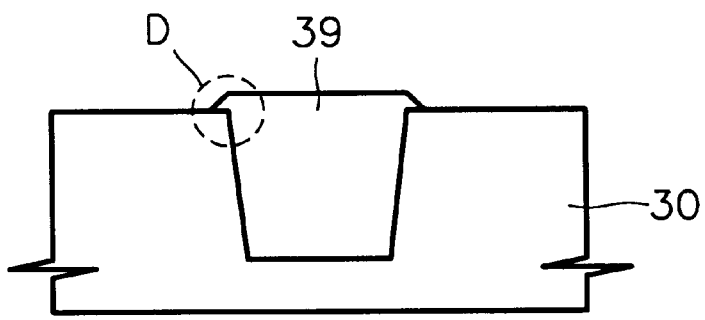

Referring to FIG. 12, deposition, densification, and planarization of a CVD oxide film filled in the trench, and removal of the films stacked in the active region, are performed by the same methods as in Example 1, thereby resulting in an isolation film 39 having an excellent profile.

EXAMPLE 3

FIGS. 14 through 18 are section views illustrating a trench isolation method according to a third embodiment of the present invention.

Figure 14:
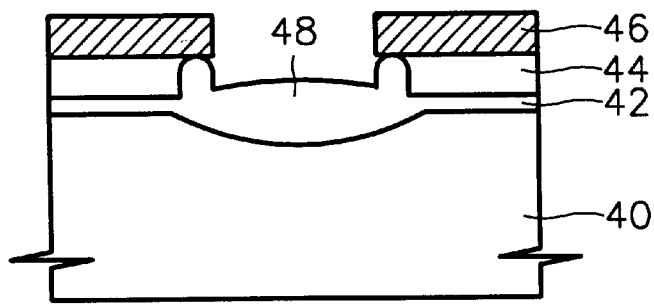
FIGS. 14 through 18 are section views illustrating a trench isolation method according to a third embodiment of the present invention.

Referring to FIG. 14, a pad oxide film 42, an oxidative film 44, and an etching mask film 46 are formed on a semiconductor substrate 40 in sequence by the same method as in Examples 1 and 2, and then the etching mask film 46 and the oxidative film 44 are anisotropically etched using a photolithography process, thereby exposing the pad oxide film 42 in the field region.

Then, an oxidation process is performed on the resultant structure in which the pad oxide film 42 of the field region is exposed, to form a field oxide film 48 having a thickness of about 500~2,000 Å on the surface of the semiconductor substrate 40 in the field region. Here, before forming the field oxide film 48, the side walls of the oxidative film 44 can be etched to form an undercut beneath the etching mask film 46.

During the process of forming the field oxide film 48, the side walls of the oxidative film 44 are oxidized at the same time. Thus, as in Examples 1 and 2, consumption of the trench filling material in the following process of etching the oxide film or planarizing the trench filling material is offset by the field oxide film formed at the sides of the oxidative film 44. As a result, the edge of the trench is prevented from being exposed. Also, the edge of the field oxide film 48 formed on the surface of the semiconductor substrate 40 has a "Bird's beak" shape, which is a characteristic of a LOCOS method. Thus, the edge of the trench to be formed in the following process is rounded, improving a profile of the edge at the active region.

Figure 15:
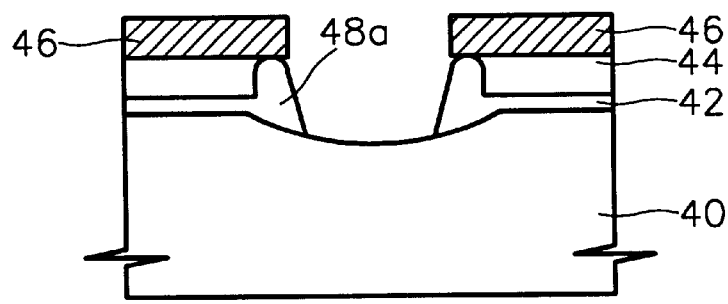

Referring to FIG. 15, when anisotropically etching the field oxide film 48 using the etching mask film 46 as an etching mask, the semiconductor substrate 40 in the field region is exposed, and a partial field oxide film 48*a* remains at the sides of the oxidative film 44.

Figure 16:
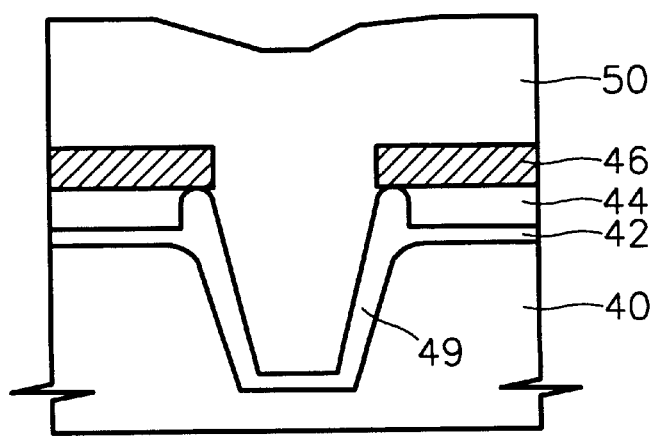

Referring to FIG. 16, the exposed semiconductor substrate 40 is anisotropically etched to a predetermined depth using the etching mask film 46 as an etching mask, to form a trench. Then, a predetermined oxidation process is performed on the semiconductor substrate 40 to form a thermal oxide film 49 on the inner walls of the trench. The oxidative film 44, on the side walls of which the partial field oxide film 48*a* remains, is exposed to the oxidation process. Thus, by the partial field oxide film 48*a* and thermal oxide film 49 formed on the side walls of the oxidative film 44 during the oxidation process, exposure of the edge of the trench is prevented in the following process of etching the oxide film or planarizing the trench filling material as described above.

Figure 18:
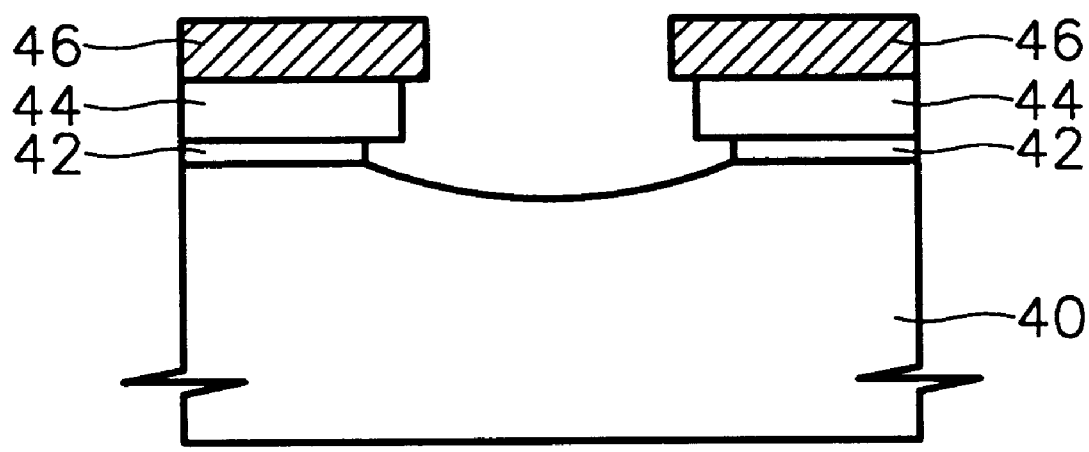

Before the oxidation process or the process of forming the trench, the partial field oxide film 48*a* (see FIG. 15) remaining at the sides of the oxidative film 44 may be removed as shown in FIG. 18. As a result, an undercut is formed at the sides of the oxidative film 44, providing the same effect as in Example 2.

Then, a CVD oxide film 50 is deposited on the entire surface of the resultant structure having the thermal oxide film 49. After depositing the CVD oxide film 50, an annealing process is performed to densify the CVD oxide film 50.

Figure 17:
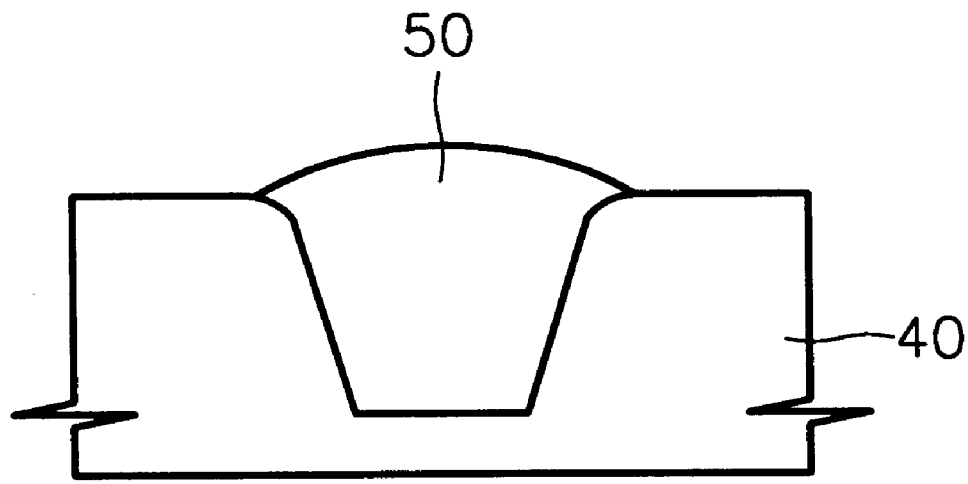

Referring to FIG. 17, the CVD oxide film filled in the trench is planarized by CMP, etch-back, or both CMP and etch-back, by using the etching mask film 46 (see FIG. 16) as a stopper. Then, the films formed in the active region are removed in sequence to leave an isolation film 50.

As described above, in the trench isolation method according to the present invention, after forming an oxidative film in an active region, a thermal oxide film is formed on the side walls of the oxidative film in a thermal oxidation process performed after the trench is formed. By the thermal oxide film formed on the side walls of the oxidative film, the active region at the edge of the trench is prevented from being exposed during the process of planarizing the trench filling material and the following processes of etching various oxide films. Thus, the humping phenomenon and inverse narrow width effect of the conventional transistor are prevented, resulting in a semiconductor device having excellent characteristics.

Also, an undercut is formed beneath the etching mask film by partially etching the side walls of the oxidative film, and an oxide film is formed at the side walls of the oxidative film, extended toward the active region, thereby delaying exposure of the edge of the trench.

In addition, prior to the formation of a trench, a field oxide film may be formed on the semiconductor substrate in a field region and may then be removed. As a result, an oxide film is formed on the side walls of the oxidative film when forming the field oxide film, so excessive consumption of the material filled in the trench during the following etching process is avoided. This prevents the edge of the trench from being exposed.

Also, because the edge of the field oxide film formed on the surface of the semiconductor substrate has a "bird's beak" shape, the edge of the trench to be formed in the following process is rounded, improving the profile of the edge of the active region.

While the present invention has been illustrated and described with reference to the specific embodiments, further modifications and alterations within the spirit and scope of this invention will occur to those skilled in the art.

What is claimed is:

1. A trench isolation method for a semiconductor device, comprising the steps of:
    (a) forming a pad oxide film, an oxidative film and an etching mask film on a semiconductor substrate in sequence;
    (b) forming a trench in a field region of the semiconductor substrate;
    (c) forming an oxide film at the inner wall of the trench and the side walls of the oxidative film by oxidizing the semiconductor substrate;
    (d) filling the trench with a dielectric material; and
    (e) removing the pad oxide film, oxidative film and etching mask film formed in an active region.

2. The trench isolation method of claim 1, wherein the oxidative film is formed of polysilicon or amorphous silicon having a high oxidation rate, to a thickness of 300~1,000 Å, and the etching mask film is formed of a nitride having excellent etching selectivity with respect to the semiconductor substrate, to a thickness of 500~2,000 Å.

3. The trench isolation method of claim 1, wherein in the step (c) the oxide film is formed to a thickness of 100~500 Å.

4. The trench isolation method of claim 1, wherein the step (d) comprises the sub-steps of:
    (d1) depositing a dielectric film on the resultant structure having the oxide film formed on the inner wall of the trench and the side walls of the oxidative film;
    (d2) planarizing the surface of the dielectric film.

5. The trench isolation method of claim 4, wherein the step (d) further comprises the sub-step of annealing the resultant structure having the dielectric film at a high temperature to densify the dielectric film, before the sub-step (d2) of planarizing the surface of the dielectric film.

6. The trench isolation method of claim 4, wherein the sub-step (d2) is performed using the etching mask film as a stopper, by a method selected from a group consisting of chemical mechanical polishing (CMP), an etch-back method, and a combination of chemical mechanical polishing and the etch-back method.

7. A trench isolation method for a semiconductor substrate, comprising the steps of:
    (a) forming a pad oxide film on a semiconductor substrate;
    (b) forming an etching mask film pattern, and an undercut oxidative film pattern beneath the etching mask film pattern, which are on the pad oxide film, to define a field region;
    (c) forming a trench in the field region of the semiconductor substrate;
    (d) forming an oxide film on the inner wall of the trench and the side walls of the oxidative film pattern;
    (e) filling the trench with a dielectric material and planarizing the dielectric material filled in the trench; and (f) removing the etching mask film pattern, oxidative film pattern and pad oxide film.

8. The trench isolation method of claim 7, wherein in the step (b) the semiconductor substrate is recessed at the same time as the undercut oxidative film is formed.

9. The trench isolation method of claim 7, wherein the oxidative film is formed of polysilicon or amorphous silicon having a high oxidation rate, to a thickness of 300~1,000 Å, and the etching mask film is formed of nitride to a thickness of 500~2,000 Å.

10. The trench isolation method of claim 7, wherein the step (b) comprises the sub-steps of:

forming an oxidative film and an etching mask film on the pad oxide film;

exposing the pad oxide film of the field region by anisotropically etching the etching mask film and oxidative film in sequence; and isotropically etching the side walls of the oxidative film.

11. The trench isolation method of claim 7, wherein the step (b) comprises the sub-steps of:

forming an oxidative film and an etching mask film on the pad oxide film;

patterning the etching mask film;

isotropically etching the oxidative film; and anisotropically etching the oxidative film.

12. The trench isolation method of claim 7, wherein in the step (b) the undercut is formed to a length of 100~700 Å.

13. The trench isolation method of claim 7, wherein in the step (d) the oxide film is formed to a thickness of 100~500 Å.

14. The trench isolation method of claim 7, further comprising the step of annealing the semiconductor substrate at a high temperature to densify the dielectric material before the planarization, after the trench is filled with the dielectric material in the step (e).

15. A trench isolation method for a semiconductor device, comprising the steps of:

(a) forming a pad oxide film, an oxidative film, and an etching mask film on a semiconductor substrate in sequence;

(b) exposing the pad film in a field region;

(c) oxidizing the surface of the semiconductor substrate in the field region to form a field oxide film;

(d) etching the field oxide film formed on the surface of the semiconductor substrate by using the etching mask film as a mask;

(e) forming a trench in the semiconductor substrate using the etching mask film;

(f) forming an oxide film on the inner wall of the trench and the side walls of the oxidative film;

(g) filling the trench with a dielectric material and planarizing the dielectric material filled trench; and (h) removing the etching mask film, oxidative film and pad oxide film.

16. The trench isolation method of claim 15, wherein the oxidative film is formed of polysilicon or amorphous silicon having a high oxidation rate, to a thickness of 300~1,000 Å, and the etching mask film is formed of nitride to a thickness of 500~2,000 Å.

17. The trench isolation method of claim 15, wherein in the step (d) the field oxide film formed on the surface of the semiconductor substrate and on the side walls of the oxidative film is completely removed.

18. The trench isolation method of claim 15, wherein in the step (d) the field oxide film formed on the semiconductor substrate is anisotropically etched using the etching mask film as a mask, such that parts of the field oxide film remain on the side walls of the oxidative film.

19. The trench isolation method of claim 18, further comprising the step of removing the parts of the field oxide film remaining on the side walls of the oxidative film before step (e) or step (f).

20. The trench isolation method of claim 15, wherein in the step (c) the field oxide film is formed to a thickness of 500~2,000 Å.

21. The trench isolation method of claim 15, wherein in the step (f) the oxide film is formed to a thickness of 100~500 Å.

22. The trench isolation method of claim 15, further comprising the step of annealing the semiconductor substrate at a high temperature to densify the dielectric material before the planarization, after the trench is filled with the dielectric material in the step (g).

23. A trench isolation method for a semiconductor device, comprising the steps of:

forming an oxidative film over a semiconductor substrate;

forming a trench in a field region of the semiconductor substrate, thereby creating a hole in the oxidative film;

forming a trench oxide film on an inner wall of the trench and on side walls of the hole in the oxidative film by oxidizing the semiconductor substrate;

filling the trench with a dielectric material; and removing the oxidative film.

24. A trench isolation method as recited in claim 23, wherein the oxidative film is formed of one of polysilicon and amorphous silicon to a thickness of 300~1,000 Å, and wherein the oxidative film has a high oxidation rate.

25. A trench isolation method as recited in claim 23, further comprising the steps of:

forming a pad oxide film over the semiconductor substrate before the step of forming an oxidative layer; and removing the pad oxide film after the step of filling the trench.

26. A trench isolation method as recited in claim 23, wherein in the trench oxide film is formed to a thickness of 100~500 Å.

27. A trench isolation method as recited in claim 23, further comprising the steps of:

forming an etching mask film over the oxidative film;

removing the etching mask film after the step of filling the trench.

28. A trench isolation method as recited in claim 27, wherein the etching mask film is formed of a nitride having excellent etching selectivity with respect to the semiconductor substrate, and wherein the etching mask film is formed to a thickness of 500~2,000 Å.

* * * * *